United States Patent
Nakamura et al.

(10) Patent No.: US 10,292,264 B2
(45) Date of Patent: May 14, 2019

(54) INSULATING CERAMIC PASTE, CERAMIC ELECTRONIC COMPONENT, AND METHOD FOR PRODUCING THE SAME

(71) Applicant: Murata Manufacturing Co., Ltd., Kyoto (JP)

(72) Inventors: Sumiyo Nakamura, Kyoto (JP); Takahiro Sumi, Kyoto (JP); Takahiro Oka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/951,808

(22) Filed: Apr. 12, 2018

(65) Prior Publication Data

US 2018/0302982 A1 Oct. 18, 2018

Related U.S. Application Data

(60) Division of application No. 14/861,272, filed on Sep. 22, 2015, now Pat. No. 9,974,168, which is a
(Continued)

(30) Foreign Application Priority Data

Mar. 27, 2013 (JP) ................................. 2013-066619

(51) Int. Cl.
*H05K 1/03* (2006.01)
*C04B 35/195* (2006.01)
(Continued)

(52) U.S. Cl.
CPC ......... *H05K 1/0306* (2013.01); *C04B 35/195* (2013.01); *C04B 35/20* (2013.01);
(Continued)

(58) Field of Classification Search
CPC ... C04B 35/195; C04B 35/20; H01L 21/4867; H01L 23/12; H01L 23/15; H05K 1/0298;
(Continued)

(56) References Cited

U.S. PATENT DOCUMENTS 6,623,845 B1 * 9/2003 Katsumura ............. C03C 3/095
257/499
2005/0067177 A1 3/2005 Saito
(Continued)

FOREIGN PATENT DOCUMENTS

CN 101543151 A 9/2009
JP S63-261789 A 10/1988
(Continued)

OTHER PUBLICATIONS

International Search Report issued in Application No. PCT/JP2014/054057 dated Apr. 1, 2014.
(Continued)

*Primary Examiner* — Steven T Sawyer
(74) *Attorney, Agent, or Firm* — Pearne & Gordon LLP (57) ABSTRACT

Provided are an insulating ceramic paste, a ceramic electronic component, and a method for producing the ceramic electronic component that allow prevention of solder shorts between narrow-pitch terminal electrodes and suppression of generation of cracks in an insulator covering a portion of terminal electrodes during a firing step. The ceramic electronic component includes a ceramic multilayer substrate, terminal electrodes formed on a surface of the ceramic multilayer substrate, and an insulating ceramic film formed on the surface of the ceramic multilayer substrate so as to cover a portion of the terminal electrodes. An exposed surface portion (celsian-crystal-rich layer) of the insulating
(Continued)

ceramic film has a thermal expansion coefficient that is lower than the thermal expansion coefficient of the ceramic multilayer substrate.

2 Claims, 4 Drawing Sheets

Related U.S. Application Data continuation of application No. PCT/JP2014/054057, filed on Feb. 20, 2014.

(51) Int. Cl.
| | |
|---|---|
| H01L 23/12 | (2006.01) |
| H01L 23/15 | (2006.01) |
| H01L 21/48 | (2006.01) |
| H05K 1/11 | (2006.01) |
| H05K 3/46 | (2006.01) |
| C04B 35/20 | (2006.01) |
| H05K 1/02 | (2006.01) |
| H05K 3/12 | (2006.01) |
| C04B 35/622 | (2006.01) |
| C04B 35/626 | (2006.01) |
| H01L 23/498 | (2006.01) |

(52) U.S. Cl.
CPC .. *C04B 35/62218* (2013.01); *C04B 35/62625* (2013.01); *H01L 21/4867* (2013.01); *H01L 23/12* (2013.01); *H01L 23/15* (2013.01); *H05K 1/0298* (2013.01); *H05K 1/111* (2013.01); *H05K 1/115* (2013.01); *H05K 3/1291* (2013.01); *H05K 3/4629* (2013.01); *C04B 2235/3215* (2013.01); *C04B 2235/3217* (2013.01); *C04B 2235/3481* (2013.01); *C04B 2235/36* (2013.01); *C04B 2235/80* (2013.01); *H01L 23/49822* (2013.01); *H01L 23/49838* (2013.01); *H01L 2924/0002* (2013.01); *H05K 2201/017* (2013.01); *H05K 2201/0209* (2013.01); *H05K 2201/068* (2013.01); *H05K 2201/099* (2013.01); *H05K 2201/09563* (2013.01); *H05K 2201/09909* (2013.01); *Y02P 70/611* (2015.11)

(58) Field of Classification Search
CPC ...... H05K 1/111; H05K 1/115; H05K 3/1291; H05K 3/4629
See application file for complete search history.

(56) References Cited

U.S. PATENT DOCUMENTS

| 2006/0019813 | A1* | 1/2006 | Yoshii | C03C 8/02 |
| | | | | 501/15 |
| 2006/0142141 | A1* | 6/2006 | Ishitobi | B32B 18/00 |
| | | | | 501/136 |
| 2009/0061178 | A1 | 3/2009 | Sugimoto | |
| 2009/0294020 | A1 | 12/2009 | Sugimoto | |
| 2012/0003450 | A1 | 1/2012 | Motoya et al. | |

FOREIGN PATENT DOCUMENTS

| JP | H09-293956 A | 11/1997 |
| JP | H11-246280 A | 9/1999 |
| JP | 2002-290043 A | 10/2002 |
| JP | 2005-108950 A | 4/2005 |
| JP | 2005-286303 A | 10/2005 |
| JP | 2008-053525 A | 3/2008 |
| JP | 4793447 B2 | 10/2011 |
| WO | 2011/081736 A2 | 7/2011 |

OTHER PUBLICATIONS

Translation of Written Opinion issued in Application No. PCT/JP2014/054057 dated Apr. 1, 2014.
Notification of Preliminary Rejection issued in Korean Patent Application No. 10-2015-7023669 dated Jul. 17, 2017.

* cited by examiner

INSULATING CERAMIC PASTE, CERAMIC ELECTRONIC COMPONENT, AND METHOD FOR PRODUCING THE SAME

This is a division of U.S. patent application Ser. No. 14/861,272 filed on Sep. 22, 2015, which is a continuation of International Application No. PCT/JP2014/054057 filed on Feb. 20, 2014, which claims priority from Japanese Patent Application No. 2013-066619 filed on Mar. 27, 2103. The contents of these applications are incorporated herein by reference in their entireties.

BACKGROUND

Technical Field

The present disclosure relates to an insulating ceramic paste, a ceramic electronic component, and a method for producing the ceramic electronic component that allow prevention of solder shorts between narrow-pitch terminal electrodes.

Conventionally, in order to meet the need for smaller electronic components, there are ceramic electronic components having narrow-pitch terminal electrodes. However, when such ceramic electronic components having narrow-pitch terminal electrodes are mounted on printed circuit boards, solder shorts tend to occur between the terminal electrodes, which is problematic.

In order to address this problem, in Patent Document 1, a ceramic module component that has a trench having a depth of 10 μm between the terminal electrodes has been proposed. This ceramic module component has the trench to thereby provide a long creepage distance between the terminal electrodes. This allows prevention of solder shorts between the terminal electrodes.

Also, in Patent Document 2, a ceramic multilayer substrate has been proposed in which the end portions of terminal electrodes are embedded so as to be bent toward the inner layer. In this ceramic multilayer substrate, the end portions of the terminal electrodes are covered with an insulator, so that the terminal electrodes have a long physical distance therebetween. As a result, solder shorts between the terminal electrodes can be prevented.

Patent Document 1: Japanese Unexamined Patent Application Publication No. 2005-108950
Patent Document 2: Japanese Unexamined Patent Application Publication No. 2005-286303

BRIEF SUMMARY

However, the ceramic module component in Patent Document 1 has a problem in that, with further reduction in the size of electronic components, the space between terminal electrodes becomes narrow, which makes it difficult to form the trench.

Also, in the ceramic multilayer substrate in Patent Document 2, stretching is caused by shrinkage of the terminal electrodes due to cooling during cooling in the firing step. This results in generation of cracks in the insulator covering the end portions of the terminal electrodes. The presence of cracks leads to a problem such as separation of the terminal electrodes. In order to prevent the generation of cracks, the insulator covering the end portions of the terminal electrodes may be formed so as to have a larger thickness. However, this hampers reduction in the thickness of the ceramic multilayer substrate.

Accordingly, the present disclosure provides an insulating ceramic paste, a ceramic electronic component, and a method for producing the ceramic electronic component that allow prevention of solder shorts between narrow-pitch terminal electrodes and suppression of generation of cracks in an insulator covering a portion of terminal electrodes during a firing step.

The present disclosure provides a ceramic electronic component including a ceramic multilayer substrate; terminal electrodes formed on a surface of the ceramic multilayer substrate; and an insulating ceramic film formed on the surface of the ceramic multilayer substrate so as to cover at least a portion of the terminal electrodes, wherein an exposed surface portion of the insulating ceramic film has a thermal expansion coefficient that is lower than a thermal expansion coefficient of the ceramic multilayer substrate.

In the present disclosure, the insulating ceramic film can be formed between the terminal electrodes so as to cover a portion of each terminal electrode.

According to the present disclosure, an insulating ceramic film is formed so as to cover at least a portion of terminal electrodes. This provides a long physical distance between the terminal electrodes, which allows prevention of solder shorts between the terminal electrodes. Formation of the insulating ceramic film between the terminal electrodes allows prevention of solder shorts between the terminal electrodes with more certainty.

In addition, the exposed surface portion of the insulating ceramic film has a thermal expansion coefficient that is lower than a thermal expansion coefficient of the ceramic multilayer substrate. Accordingly, the shrinkage amount of the exposed surface portion of the insulating ceramic film is small during cooling in the firing step. Thus, compressive stress is applied to the exposed surface portion of the insulating ceramic film. As a result, the insulating ceramic film tends not to be stretched by shrinkage of the terminal electrodes due to cooling. Thus, cracks tend not to be generated in a portion of the insulating ceramic film on the terminal electrodes.

In the present disclosure, the insulating ceramic film can contain celsian crystals, and an amount of celsian crystals in the exposed surface portion of the insulating ceramic film can be larger than an amount of celsian crystals in a portion of the insulating ceramic film, the portion being in contact with the ceramic multilayer substrate and the terminal electrodes.

According to the present disclosure, in a case where a relatively large amount of celsian crystals having a low thermal expansion coefficient are present in the exposed surface portion of the insulating ceramic film, cracks tend not to be generated in a portion of the insulating ceramic film on the terminal electrodes.

The present disclosure also provides a method for producing a ceramic electronic component, the method including: a step of forming terminal electrodes with a conductive paste on a surface of an outer-layer ceramic green sheet; a step of forming an internal electrode with a conductive paste on a surface of an inner-layer ceramic green sheet; a step of laminating the outer-layer ceramic green sheet and inner-layer ceramic green sheets to form a green multilayer body in which the internal electrode is disposed at an interface between the inner-layer ceramic green sheets and the terminal electrodes are disposed on the surface of the outer-layer ceramic green sheet; a step of forming an insulating ceramic film with an insulating ceramic paste so as to cover at least a portion of the terminal electrodes formed on a surface of the green multilayer body; and a step of firing the green multilayer body to provide a sintered multilayer body, wherein the insulating ceramic paste at least contains an aggregate, a BaO-containing glass, and an Al-containing inorganic substance, and the BaO-containing glass has a 20 to 30 mol % BaO content, assuming that a total content of the aggregate, the Al-containing inorganic substance, and the BaO-containing glass is 100 vol %, (i) a content a of the aggregate satisfies 50.0 vol %≤a≤70.2 vol %, (ii) a content b of the Al-containing inorganic substance satisfies 3.0 vol %≤b≤18.0 vol %, and (iii) a content c of the BaO-containing glass satisfies 25.0 vol %≤c≤37.0 vol %.

As a material for the aggregate, forsterite can be used. As a material for the Al-containing inorganic substance, alumina or cordierite is used, for example.

According to the present disclosure, during the firing step, the amount of celsian crystals in the exposed surface portion of the insulating ceramic film is made larger than the amount of celsian crystals in a portion of the insulating ceramic film, the portion being in contact with the ceramic multilayer substrate and the terminal electrodes. Thus, ceramic electronic components in which the thermal expansion coefficient of the exposed surface portion of the insulating ceramic film is lower than the thermal expansion coefficient of the ceramic multilayer substrate can be efficiently mass-produced.

The present disclosure also provides an insulating ceramic paste at least including an aggregate, an Al-containing inorganic substance, a BaO-containing glass, and a solvent, wherein the BaO-containing glass has a 20 to 30 mol % BaO content, assuming that a total content of the aggregate, the Al-containing inorganic substance, and the BaO-containing glass is 100 vol %, (i) a content a of the aggregate satisfies 50.0 vol %≤a≤70.2 vol %, (ii) a content b of the Al-containing inorganic substance satisfies 3.0 vol %≤b≤18.0 vol %, and (iii) a content c of the BaO-containing glass satisfies 25.0 vol %≤c≤37.0 vol %.

As a material for the aggregate, forsterite can be used. As a material for the Al-containing inorganic substance, alumina or cordierite is used, for example.

Firing of an insulating ceramic paste according to the present disclosure results in formation of a relatively large amount of celsian crystals in an exposed surface portion to thereby provide an insulating ceramic in which the exposed surface portion has a low thermal expansion coefficient.

According to the present disclosure, during the firing step, generation of cracks in the insulating ceramic film can be suppressed. Thus, separation of the terminal electrodes can be suppressed and solder shorts between the terminal electrodes can also be suppressed.

The above-described object, other objects, features, and advantages according to the present disclosure will be more apparent from the following section of DETAILED DESCRIPTION with reference to drawings.

DETAILED DESCRIPTION

Embodiments of an insulating ceramic paste, a ceramic electronic component, and a method for producing the ceramic electronic component according to the present disclosure will be described.

1. First Embodiment

Figure 1:
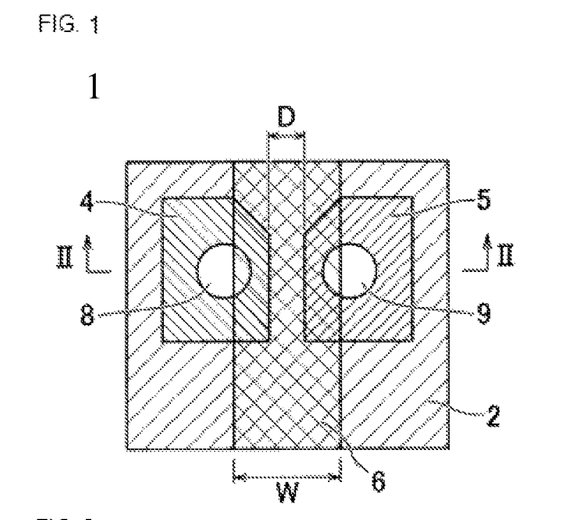
FIG. 1 is a plan view illustrating a ceramic electronic component according to a first embodiment of the present disclosure.
Figure 2:
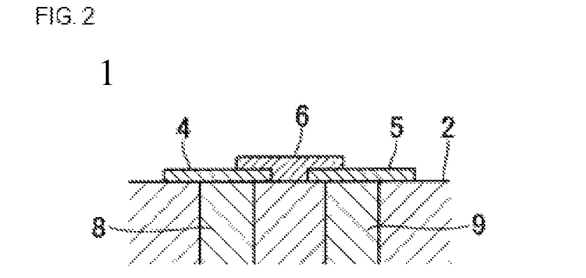
FIG. 2 is a sectional view corresponding to FIG. 1, taken along line II-II in FIG. 1.

FIG. 1 is a plan view illustrating a ceramic electronic component 1 according to a first embodiment. FIG. 2 is a vertical sectional view of the ceramic electronic component 1. The ceramic electronic component 1 generally includes a ceramic multilayer substrate 2, terminal electrodes 4 and 5, an insulating ceramic film 6, and via holes 8 and 9.

The terminal electrodes 4 and 5 are formed at a narrow pitch (a distance D of 50 μm in the first embodiment) on a surface (the mounting surface of the ceramic electronic component 1) of the ceramic multilayer substrate 2. The terminal electrodes 4 and 5 are formed of, for example, Ag, Cu, Ni, or an alloy of such a metal.

The insulating ceramic film 6 is formed on the surface of the ceramic multilayer substrate 2 so as to be disposed between the terminal electrodes 4 and 5 and to cover portions of the neighboring sides of the terminal electrodes 4 and 5. As materials for the ceramic multilayer substrate 2, a forsterite powder and a glass powder are contained. As materials for the insulating ceramic film 6, a forsterite powder serving as an aggregate, and an Al-containing inorganic substance and a BaO-containing glass are contained. Thus, a firing step for the ceramic electronic component 1 provides the insulating ceramic film 6 containing celsian crystals in which the amount of celsian crystals in an exposed surface portion is larger than the amount of celsian crystals in a portion in contact with the ceramic multilayer substrate 2 and the terminal electrodes 4 and 5. Accordingly, the exposed surface portion of the insulating ceramic film 6 has a thermal expansion coefficient that is lower than the thermal expansion coefficient of the ceramic multilayer substrate 2. In the first embodiment, the insulating ceramic film 6 has a width W of 150 μm. Incidentally, the aggregate is a material that is to serve as a main component of ceramic.

The via holes 8 and 9 are formed within the ceramic multilayer substrate 2. The via holes 8 and 9 are individually filled with conductive materials and the top end portions of the conductive materials are electrically connected to the terminal electrodes 4 and 5. The terminal electrodes 4 and 5 are electrically connected to internal electrodes (not shown) via the via holes 8 and 9.

In the ceramic electronic component 1 having the above-described configuration, the insulating ceramic film 6 is formed between the terminal electrodes 4 and 5 so as to cover portions of the terminal electrodes 4 and 5. Thus, the physical distance between the terminal electrodes 4 and 5 is long, so that solder shorts between the terminal electrodes 4 and 5 can be prevented.

In addition, since the exposed surface portion of the insulating ceramic film 6 has a thermal expansion coefficient that is lower than the thermal expansion coefficient of the ceramic multilayer substrate 2, the amount of shrinkage of the exposed surface portion of the insulating ceramic film 6 is smaller than that of the ceramic multilayer substrate 2 during cooling in the firing step. As a result, compressive stress is applied to the exposed surface portion of the insulating ceramic film 6 to suppress shrinkage of the terminal electrodes 4 and 5. Thus, the insulating ceramic film 6 tends not to be stretched by the terminal electrodes 4 and 5 and cracks tend not to be generated in portions of the insulating ceramic film 6 on the terminal electrodes 4 and 5.

2. Second Embodiment

Figure 3:
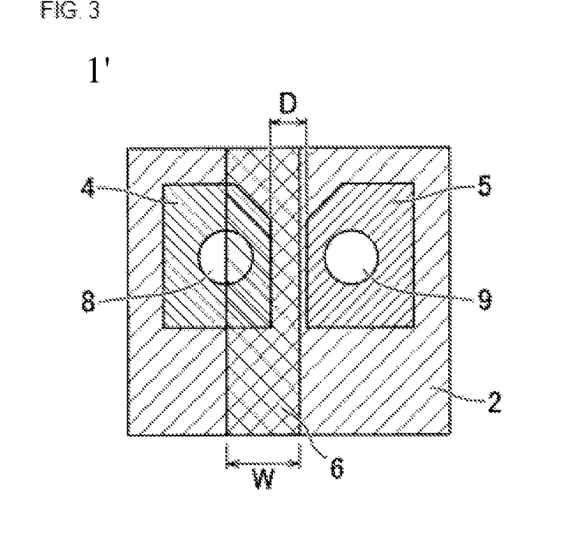
FIG. 3 is a plan view illustrating a ceramic electronic component according to a second embodiment of the present disclosure.

FIG. 3 is a plan view illustrating a ceramic electronic component 1' according to a second embodiment. The ceramic electronic component 1' generally includes a ceramic multilayer substrate 2, terminal electrodes 4 and 5, an insulating ceramic film 6, and via holes 8 and 9.

The terminal electrodes 4 and 5 are formed at a narrow pitch (a distance D of 50 μm in the second embodiment) on a surface (the mounting surface of the ceramic electronic component 1') of the ceramic multilayer substrate 2 so as to face each other.

The insulating ceramic film 6 is formed on the surface of the ceramic multilayer substrate 2 so as to cover a portion of the terminal electrode 4, which is one of the terminal electrodes 4 and 5 facing each other. As materials for the ceramic multilayer substrate 2, a forsterite powder and a glass powder are contained. As materials for the insulating ceramic film 6, a forsterite powder, an Al-containing inorganic substance, and a BaO-containing glass are contained. Thus, a firing step for the ceramic electronic component 1' provides the insulating ceramic film 6 containing celsian crystals in which the amount of celsian crystals in an exposed surface portion is larger than the amount of celsian crystals in a portion in contact with the ceramic multilayer substrate 2 and the terminal electrodes 4 and 5. Accordingly, the exposed surface portion of the insulating ceramic film 6 has a thermal expansion coefficient that is lower than the thermal expansion coefficient of the ceramic multilayer substrate 2. In the second embodiment, the insulating ceramic film 6 has a width W of 100 μm.

The via holes 8 and 9 are formed within the ceramic multilayer substrate 2. The via holes 8 and 9 are individually filled with conductive materials and the top end portions of the conductive materials are electrically connected to the terminal electrodes 4 and 5. The terminal electrodes 4 and 5 are electrically connected to internal electrodes (not shown) via the via holes 8 and 9.

The ceramic electronic component 1' having the above-described configuration provides advantages as with the ceramic electronic component 1 according to the first embodiment.

3. Third Embodiment

Figure 4:
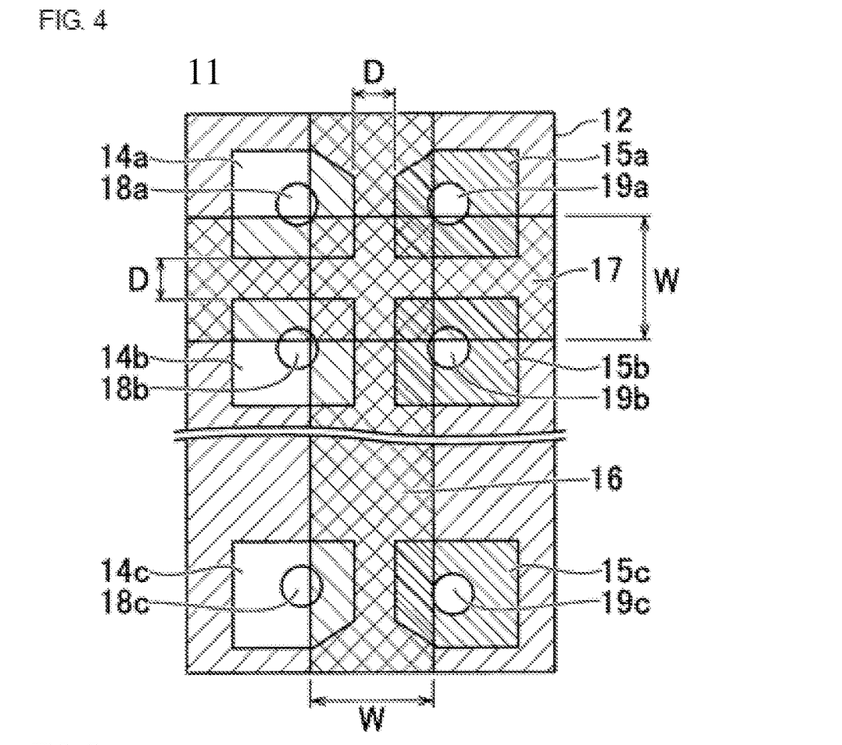
FIG. 4 is a plan view illustrating a ceramic electronic component according to a third embodiment of the present disclosure.

FIG. 4 is a plan view illustrating a ceramic electronic component 11 according to a third embodiment. The ceramic electronic component 11 generally includes a ceramic multilayer substrate 12, terminal electrodes 14a to 14c and 15a to 15c, insulating ceramic films 16 and 17, and via holes 18a to 18c and 19a to 19c.

The terminal electrodes 14a to 14c and 15a to 15c are formed at a narrow pitch (a distance D of 50 μm in the third embodiment) on a surface (the mounting surface of the ceramic electronic component 11) of the ceramic multilayer substrate 12.

The insulating ceramic films 16 and 17 are formed on the surface of the ceramic multilayer substrate 12 so as to be disposed between the terminal electrodes 14a to 14c and 15a to 15c and to cover portions of neighboring sides of the terminal electrodes 14a to 14c and 15a to 15c. As materials for the ceramic multilayer substrate 12, a forsterite powder and a glass powder are contained. As materials for the insulating ceramic films 16 and 17, a forsterite powder, an Al-containing inorganic substance, and a BaO-containing glass are contained. Thus, a firing step for the ceramic electronic component 11 provides the insulating ceramic films 16 and 17 containing celsian crystals in which the amount of celsian crystals in an exposed surface portion is larger than that in portions in contact with the ceramic multilayer substrate 12 and the terminal electrodes 14a to 14c and 15a to 15c. Accordingly, the exposed surface portion of the insulating ceramic films 16 and 17 has a thermal expansion coefficient that is lower than the thermal expansion coefficient of the ceramic multilayer substrate 12. In the third embodiment, the insulating ceramic films 16 and 17 have a width W of 150 μm.

The via holes 18a to 18c and 19a to 19c are formed within the ceramic multilayer substrate 12. The via holes 18a to 18c and 19a to 19c are individually filled with conductive materials and the top end portions of the conductive materials are electrically connected to the terminal electrodes 14a to 14c and 15a to 15c.

The ceramic electronic component 11 having the above-described configuration provides advantages as with the ceramic electronic component 1 according to the first embodiment.

4. Fourth Embodiment (Ceramic Electronic Component)

Figure 5:
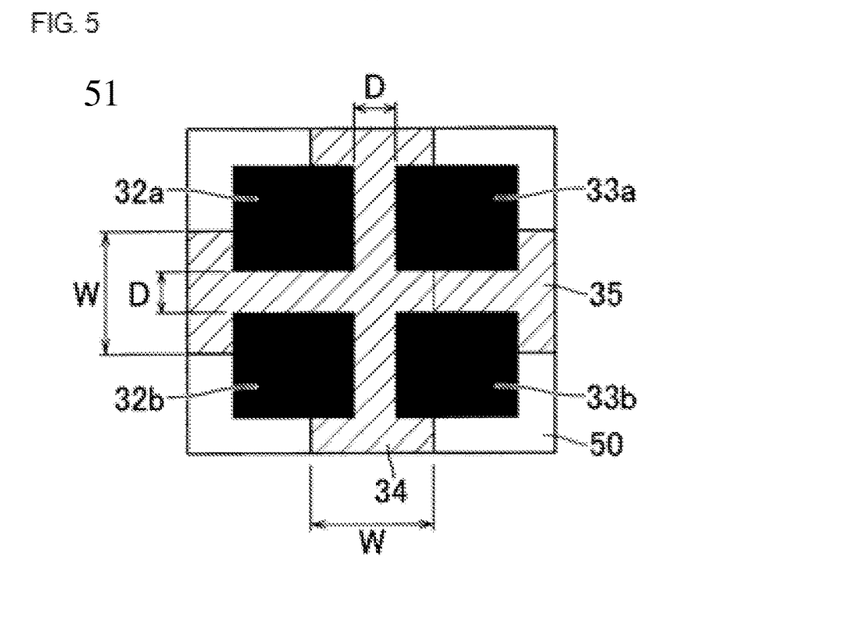
FIG. 5 is a plan view illustrating a ceramic electronic component according to a fourth embodiment of the present disclosure.

FIG. 5 is a plan view illustrating a ceramic electronic component 51 according to a fourth embodiment. The ceramic electronic component 51 generally includes a ceramic multilayer substrate 50, terminal electrodes 32a, 32b, 33a, and 33b, an insulating ceramic film 34, and internal electrodes 22a and 23a (refer to FIGS. 6A-6D).

The terminal electrodes 32a, 32b, 33a, and 33b are formed at a narrow pitch (a distance D of 50 μm in the fourth embodiment) on a surface (the mounting surface of the ceramic electronic component 51) of the ceramic multilayer substrate 50.

The insulating ceramic film 34 is formed on the surface of the ceramic multilayer substrate 50 so as to be disposed between the terminal electrodes 32a, 32b, 33a, and 33b and to cover portions of neighboring sides of the terminal electrodes 32a, 32b, 33a, and 33b. As materials for the ceramic multilayer substrate 50, a forsterite powder and a glass powder are contained. As materials for the insulating ceramic film 34, a forsterite powder, an Al-containing inorganic substance, and a BaO-containing glass are contained. Thus, a firing step for the ceramic electronic component 51 provides the insulating ceramic film 34 containing celsian crystals in which the amount of celsian crystals in an exposed surface portion is larger than that in portions in contact with the ceramic multilayer substrate 50 and the terminal electrodes 32a, 32b, 33a, and 33b. Accordingly, the exposed surface portion of the insulating ceramic film 34 has a thermal expansion coefficient that is lower than the thermal expansion coefficient of the ceramic multilayer substrate 50. In the fourth embodiment, the insulating ceramic film 34 has a width W of 150 μm.

The ceramic electronic component 51 having the above-described configuration provides advantages as with the ceramic electronic component 1 according to the first embodiment.

(Method for Producing Ceramic Electronic Component)

Hereinafter, a method for producing the ceramic electronic component 51 will be described with reference to FIGS. 6A-6D.

(Production of Ceramic Green Sheets)

The same materials are used for an outer-layer ceramic green sheet 30 and inner-layer ceramic green sheets 20 and 40. However, obviously, materials for the outer-layer ceramic green sheet 30 may be different from materials for the inner-layer ceramic green sheets 20 and 40.

First, as main-component powders, a forsterite powder and a glass powder are prepared.

Subsequently, a butyral resin and DOP (plasticizer) are added to the main-component powders. The resultant mixture is wet-blended with a ball mill to prepare ceramic slurry. The ceramic slurry is shaped into sheets by the doctor blade method and dried to provide the outer-layer ceramic green sheet 30 and the inner-layer ceramic green sheets 20 and 40.

(Preparation of Insulating Ceramic Paste)

An insulating ceramic paste was prepared with a forsterite powder serving as an aggregate, an Al-containing inorganic substance, a BaO-containing glass, a solvent, and ETHO-CEL resin. The BaO-containing glass is prepared so as to have a 20 to 30 mol % BaO content.

The forsterite, the Al-containing inorganic substance, and the BaO-containing glass are prepared such that, assuming that the total content of the forsterite, the Al-containing inorganic substance, and the BaO-containing glass is 100 vol %, (i) the content a of the forsterite satisfies 50.0 vol % ≤ a ≤ 70.2 vol %, (ii) the content b of the Al-containing inorganic substance satisfies 3.0 vol % ≤ b ≤ 18.0 vol %, and (iii) the content c of the BaO-containing glass satisfies 25.0 vol % ≤ c ≤ 37.0 vol %.

As the material for the aggregate, forsterite is used in the embodiment. However, the material is not particularly limited to forsterite. Examples of the material include calcium zirconate and strontium zirconate. Examples of the material for the Al-containing inorganic substance include alumina ($Al_2O_3$) and cordierite ($2MgO.2Al_2O_3.5SiO_2$).

(Production of Ceramic Electronic Component)

FIGS. 6A-6D illustrate sectional views for explaining a method for producing the ceramic electronic component illustrated in FIG. 5.

Figure 6:
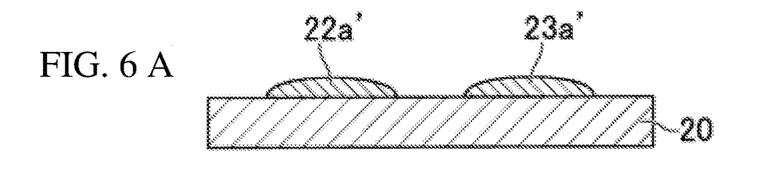
FIGS. 6A-6D illustrate sectional views for explaining a method for producing the ceramic electronic component illustrated in FIG. 5.

First, as illustrated in FIG. 6A, screen printing with a conductive paste (such as Cu paste) is carried out on a surface of the inner-layer ceramic green sheet 20 to form internal-electrode conductive-paste films 22a' and 23a'.

Subsequently, as illustrated in FIG. 6B, screen printing with a conductive paste (such as Cu paste) is carried out on a surface of the outer-layer ceramic green sheet 30 to form terminal-electrode conductive-paste films 32a', 32b', 33a', and 33b'. Incidentally, FIGS. 6A-6D, which illustrate a method for producing the ceramic electronic component illustrated in FIG. 5, provide sectional views for illustrating the method for producing the ceramic electronic component 51. Accordingly, FIGS. 6A-6D do not show the terminal electrodes 32b and 33b and the terminal-electrode conductive pastes 32b' and 33b' that are to serve as the terminal electrodes 32b and 33b.

Subsequently, the outer-layer ceramic green sheet 30 and the inner-layer ceramic green sheet 20 are laminated with the inner-layer ceramic green sheet 40 interposed therebetween for thickness adjustment and are subjected to thermal pressure bonding. This forms a green ceramic multilayer substrate 50 in which the internal-electrode conductive-paste films 22a' and 23a' are disposed at the interface between the laminated inner-layer ceramic green sheets 20 and 40 and the terminal-electrode conductive-paste films 32a', 32b', 33a', and 33b' are disposed on the surface of the outer-layer ceramic green sheet 30.

Subsequently, as illustrated in FIG. 6C, screen printing is carried out such that the insulating ceramic paste is positioned between the terminal-electrode conductive-paste films 32a', 32b', 33a', and 33b' formed on the surface of the green ceramic multilayer substrate 50 and covers portions of neighboring sides of the terminal-electrode conductive-paste films 32a', 32b', 33a', and 33b'. Thus, an insulating ceramic paste film 34' is formed.

Subsequently, the green ceramic multilayer substrate 50 is divided by cutting in accordance with a predetermined product size (a rectangular shape having a length of 0.65 mm and a width of 0.45 mm). The divided green ceramic multilayer substrates 50 are fired in a reducing atmosphere containing $N_2$—$H_2$-$H_2O$ gas. Thus, sintered ceramic multilayer substrates 50 are provided.

As illustrated in FIG. 6D, the ceramic green sheets 20, 30, and 40, the conductive-paste films 22a', 23a', 32a', 32b', 33a', and 33b', and the insulating ceramic paste film 34' are simultaneously fired. The inner-layer ceramic green sheets 20 and 40 are turned into inner ceramic layers. The outer-layer ceramic green sheet 30 is turned into an outer ceramic layer. The internal-electrode conductive-paste films 22a' and 23a' are turned into the internal electrodes 22a and 23a. The terminal-electrode conductive-paste films 32a', 32b', 33a', and 33b' are turned into the terminal electrodes 32a, 32b, 33a, and 33b.

The insulating ceramic paste film 34' is turned into the insulating ceramic film 34 containing celsian crystals. The insulating ceramic film 34 has a celsian-crystal-rich layer 34a in the exposed surface portion. The amount of celsian crystals in the celsian-crystal-rich layer 34a is larger than the amount of celsian crystals in portions of the insulating ceramic film 34, the portions being in contact with the ceramic multilayer substrate 50 and the terminal electrodes 32a, 32b, 33a, and 33b.

The above-described production method allows efficient mass-production of the ceramic electronic component 51 in which the exposed surface portion (celsian-crystal-rich layer 34a) of the insulating ceramic film 34 has a thermal expansion coefficient that is lower than the thermal expansion coefficient of the ceramic multilayer substrate 50.

EXAMPLES

1. Examples

The ceramic electronic components 51 according to the fourth embodiment were produced by the above-described production method and evaluated in terms of characteristics. In the production, the insulating ceramic pastes were prepared such that a forsterite powder, an Al-containing inorganic substance, a BaO-containing glass, a solvent, and ETHOCEL resin were weighed so as to satisfy compositions in Table 1. In Table 1, "G1" to "G4" of the BaO-containing glass mean that the BaO content is 10 to 40 mol % as described in Table 2.

TABLE 1

| Name of paste | Forsterite (vol %) | Al-containing inorganic substance (vol %) | | Ba-containing glass (vol %) | | | | Solvent (vol %) | ETHOCEL (vol %) |
|---|---|---|---|---|---|---|---|---|---|
| | | Al2O3 | Cordierite | G1 | G2 | G3 | G4 | | |
| P-1 | 19.6 | 1.4 | — | — | 7.0 | — | — | 66.4 | 5.6 |
| P-2 | 17.6 | 0.8 | — | — | 9.5 | — | — | 66.4 | 5.6 |
| P-3 | 15.6 | 2.0 | — | — | 10.4 | — | — | 66.4 | 5.6 |
| P-4 | 14.0 | 4.2 | — | — | 9.8 | — | — | 66.4 | 5.6 |
| P-5 | 16.0 | 5.0 | — | — | 7.0 | — | — | 66.4 | 5.6 |
| P-6 | 17.6 | 3.4 | — | — | 7.0 | — | — | 66.4 | 5.6 |
| P-7 | 17.6 | 2.5 | — | — | 7.8 | — | — | 66.4 | 5.6 |
| P-8 | 17.6 | 1.7 | — | — | 8.7 | — | — | 66.4 | 5.6 |
| P-9* | 21.0 | 0.0 | — | — | 7.0 | — | — | 66.4 | 5.6 |
| P-10* | 16.8 | 0.0 | — | — | 11.2 | — | — | 66.4 | 5.6 |
| P-11* | 14.0 | 2.8 | — | — | 11.2 | — | — | 66.4 | 5.6 |
| P-12* | 14.0 | 5.6 | — | — | 8.4 | — | — | 66.4 | 5.6 |
| P-13* | 19.6 | 2.8 | — | — | 5.6 | — | — | 66.4 | 5.6 |
| P-14* | 17.6 | 1.7 | — | 8.7 | — | — | — | 66.4 | 5.6 |
| P-15 | 17.6 | 1.7 | — | — | — | 8.7 | — | 66.4 | 5.6 |
| P-16* | 17.6 | 1.7 | — | — | — | — | 8.7 | 66.4 | 5.6 |
| P-17 | 19.6 | — | 1.4 | — | 7.0 | — | — | 66.4 | 5.6 |
| P-18 | 17.6 | — | 0.8 | — | 9.5 | — | — | 66.4 | 5.6 |
| P-19 | 15.6 | — | 2.0 | — | 10.4 | — | — | 66.4 | 5.6 |
| P-20 | 14.0 | — | 4.2 | — | 9.8 | — | — | 66.4 | 5.6 |
| P-21 | 16.0 | — | 5.0 | — | 7.0 | — | — | 66.4 | 5.6 |

*indicates not being within the scope of the present disclosure.

TABLE 2

| BaO-containing glass | BaO content (mol %) |
|---|---|
| G1 | 10 |
| G2 | 20 |
| G3 | 30 |
| G4 | 40 |

2. Evaluations of Characteristics and Evaluation Methods in Examples

Each sample was subjected to the following evaluations of characteristics.

(Evaluation of Cracks in Insulating Ceramic Film)

The insulating ceramic film 34 of the ceramic electronic component 51 was visually inspected for cracks in the insulating ceramic film 34. In addition, the ceramic electronic component 51 was solder-mounted on a printed circuit board (printed board) and subjected to a test of free fall from a height of 180 cm three times. After the test, the insulating ceramic film 34 was visually inspected for cracks in the insulating ceramic film 34. The samples not having cracks in the insulating ceramic film 34 were evaluated as "Good", and the samples having cracks were evaluated as "Poor".

(Evaluation of Celsian Crystals in Insulating Ceramic Film)

A vertical section of the ceramic electronic component 51 was exposed by polishing and celsian crystals in the insulating ceramic film 34 were observed with a scanning electron microscope (SEM). The samples in which the amount of celsian crystals in the exposed surface portion (celsian-crystal-rich layer 34a) of the insulating ceramic film 34 was larger than that in portions of the insulating ceramic film 34 in contact with the ceramic multilayer substrate 50 and the terminal electrodes 32a, 32b, 33a, and 33b were evaluated as "Good". And the samples in which the former amount was substantially equal to or smaller than the latter amount were evaluated as "Poor".

(Evaluation of Coplanarity)

Coplanarity means the amount of irregularities of the terminal electrodes 32a, 32b, 33a, and 33b and the insulating ceramic film 34 disposed on the mounting surface of the ceramic electronic component 51, with respect to the surface of the printed circuit board. The samples found to have a coplanarity of less than 20 μm were judged as having high coplanarity and evaluated as "Good". The samples found to have a coplanarity of 20 μm or more were judged as having low coplanarity and evaluated as "Poor".

3. Results of Evaluations of Characteristics in Examples

Table 3 describes results of the evaluations of characteristics in Examples.

| | | | | | Celsian crystals | | | | |
|---|---|---|---|---|---|---|---|---|---|
| | | | | | Amount of crystals (vol %) | | Difference in amount of crystals | | |
| Sample No. | Name of paste | Cracks | Cracks after drop test | Within 2 μm from surface | 2 μm to 20 μm | between surface portion and inner portion | Evaluation | Coplanarity | Total evaluation |
| 1 | P-1 | Good | Good | 85 | 51 | 34 | Good | Good | Good |
| 2 | P-2 | Good | Good | 40 | 10 | 30 | Good | Good | Good |
| 3 | P-3 | Good | Good | 41 | 11 | 29 | Good | Good | Good |
| 4 | P-4 | Good | Good | 42 | 12 | 29 | Good | Good | Good |

-continued

| | | | Cracks after drop test | Celsian crystals | | | | | |
|---|---|---|---|---|---|---|---|---|---|
| | | | | Amount of crystals (vol %) | | Difference in amount of crystals | | | |
| Sample No. | Name of paste | Cracks | | Within 2 μm from surface | 2 μm to 20 μm | between surface portion and inner portion | Evaluation | Coplanarity | Total evaluation |
| 5 | P-5 | Good | Good | 87 | 54 | 33 | Good | Good | Good |
| 6 | P-6 | Good | Good | 88 | 51 | 37 | Good | Good | Good |
| 7 | P-7 | Good | Good | 81 | 41 | 40 | Good | Good | Good |
| 8 | P-8 | Good | Good | 74 | 30 | 44 | Good | Good | Good |
| 9 | P-9* | Poor | Poor | 4 | 4 | 0 | Poor | Poor | Poor |
| 10 | P-10* | Poor | Poor | 3 | 4 | 0 | Poor | Poor | Poor |
| 11 | P-11* | Good | Poor | 66 | 67 | −1 | Poor | Poor | Poor |
| 12 | P-12* | Good | Poor | 88 | 84 | 4 | Poor | Good | Poor |
| 13 | P-13* | Good | Poor | 7 | 8 | −1 | Poor | Good | Poor |
| 14 | P-14* | Good | Poor | 8 | 11 | −3 | Poor | Good | Poor |
| 15 | P-15 | Good | Good | 74 | 30 | 44 | Good | Good | Good |
| 16 | P-16* | Good | Poor | 81 | 82 | −1 | Poor | Good | Poor |
| 17 | P-17 | Good | Good | 86 | 51 | 35 | Good | Good | Good |
| 18 | P-18 | Good | Good | 40 | 11 | 29 | Good | Good | Good |
| 19 | P-19 | Good | Good | 41 | 10 | 30 | Good | Good | Good |
| 20 | P-20 | Good | Good | 43 | 13 | 30 | Good | Good | Good |
| 21 | P-21 | Good | Good | 89 | 56 | 34 | Good | Good | Good |

*indicates not being within the scope of the present disclosure.

In the cases of Sample Nos. 9 and 10 (no Al-containing inorganic substance was mixed in the preparation of the insulating ceramic pastes), which are not within the scope of the present disclosure, celsian crystals were not formed in the insulating ceramic films 34. As a result, cracks were generated in the insulating ceramic films 34. Also, the amount of the BaO-containing glass was excessively large, so that forsterite was excessively sintered, resulting in poor coplanarity.

In the case of Sample No. 11 (a large amount of the BaO-containing glass was mixed in the preparation of the insulating ceramic paste), which is not within the scope of the present disclosure, forsterite was excessively sintered, resulting in poor coplanarity. Also, celsian crystals were formed uniformly throughout the insulating ceramic film 34. Cracks generated in the insulating ceramic film 34 were observed after the drop test.

In the case of Sample No. 12 (a large amount of the Al-containing inorganic substance was mixed in the preparation of the insulating ceramic paste), which is not within the scope of the present disclosure, celsian crystals were formed uniformly throughout the insulating ceramic film 34. Cracks generated in the insulating ceramic film 34 were observed after the drop test.

In the case of Sample No. 13 (small amounts of the Al-containing inorganic substance and BaO-containing glass were mixed in the preparation of the insulating ceramic paste), which is not within the scope of the present disclosure, the amount of celsian crystals formed in the insulating ceramic film 34 was small. Thus, cracks generated in the insulating ceramic film 34 were observed after the drop test.

In the case of Sample No. 14 (the BaO-containing glass having a 10 mol % BaO content was mixed in the preparation of the insulating ceramic paste), which is not within the scope of the present disclosure, the BaO ratio was excessively low and the amount of celsian crystals formed in the insulating ceramic film 34 was small. Accordingly, cracks generated in the insulating ceramic film 34 were observed after the drop test.

In the case of Sample No. 16 (the BaO-containing glass having a 40 mol % BaO content was mixed in the preparation of the insulating ceramic paste), which is not within the scope of the present disclosure, the BaO ratio was excessively high and celsian crystals were formed uniformly throughout the insulating ceramic film 34. Cracks generated in the insulating ceramic film 34 were observed after the drop test.

In contrast, in the cases of Sample Nos. 1 to 8, 15, and 17 to 21, which are within the scope of the present disclosure, the BaO-containing glass and the Al-containing inorganic substance sufficiently reacted, so that celsian crystals were effectively generated in each insulating ceramic film 34. Specifically, celsian crystals were formed such that the amount of celsian crystals in the exposed surface portion (celsian-crystal-rich layer 34a) in the insulating ceramic film 34 was larger than that in portions of the insulating ceramic film 34 in contact with the ceramic multilayer substrate 50 and the terminal electrodes 32a, 32b, 33a, and 33b. This resulted in suppression of generation of cracks in the insulating ceramic film 34 and also no cracks generated in the insulating ceramic film 34 were observed after the drop test.

Sample Nos. 8, 14, 15, and 16 indicate that, in the present disclosure, the BaO-containing glass is prepared such that the BaO content is 20 to 30 mol %.

Table 4 describes calculation results of the contents of forsterite, the Al-containing inorganic substance, and the BaO-containing glass, assuming that the total content of these three components of forsterite, the Al-containing inorganic substance, and the BaO-containing glass is 100 vol %, regarding Sample Nos. 1 to 8 and 17 to 21, which are within the scope of the present disclosure, and Sample Nos. 9 to 13, which are not within the scope of the present disclosure.

TABLE 4

| Name of paste | Al-containing inorganic substance | | For-sterite | Ba-containing glass | Total content of three components |
|---|---|---|---|---|---|
| | AL2O3 | Cordierite | | | |
| P-1 | 4.8 | — | 70.2 | 25.0 | 0.00 |
| P-2 | 3.0 | — | 63.0 | 34.0 | 100.00 |
| P-3 | 7.2 | — | 55.8 | 37.0 | 100.00 |
| P-4 | 15.0 | — | 50.0 | 35.0 | 100.00 |
| P-5 | 18.0 | — | 57.0 | 25.0 | 100.00 |
| P-6 | 12.0 | — | 63.0 | 25.0 | 100.00 |
| P-7 | 9.0 | — | 63.0 | 28.0 | 100.00 |
| P-8 | 6.0 | — | 63.0 | 31.0 | 100.00 |
| P-9* | 0.0 | — | 75.0 | 25.0 | 100.00 |
| P-10* | 0.0 | — | 60.0 | 40.0 | 100.00 |
| P-11* | 10.0 | — | 50.0 | 40.0 | 100.00 |
| P-12* | 20.0 | — | 50.0 | 30.0 | 100.00 |
| P-13* | 10.0 | — | 70.0 | 20.0 | 100.00 |
| P-17 | — | 4.8 | 70.2 | 25.0 | 100.00 |
| P-18 | — | 3.0 | 63.0 | 34.0 | 100.00 |
| P-19 | — | 7.2 | 55.8 | 37.0 | 100.00 |
| P-20 | — | 15.0 | 50.0 | 35.0 | 100.00 |
| P-21 | — | 18.0 | 57.0 | 25.0 | 100.00 |

*indicates not being within the scope of the present disclosure.

Figure 7:
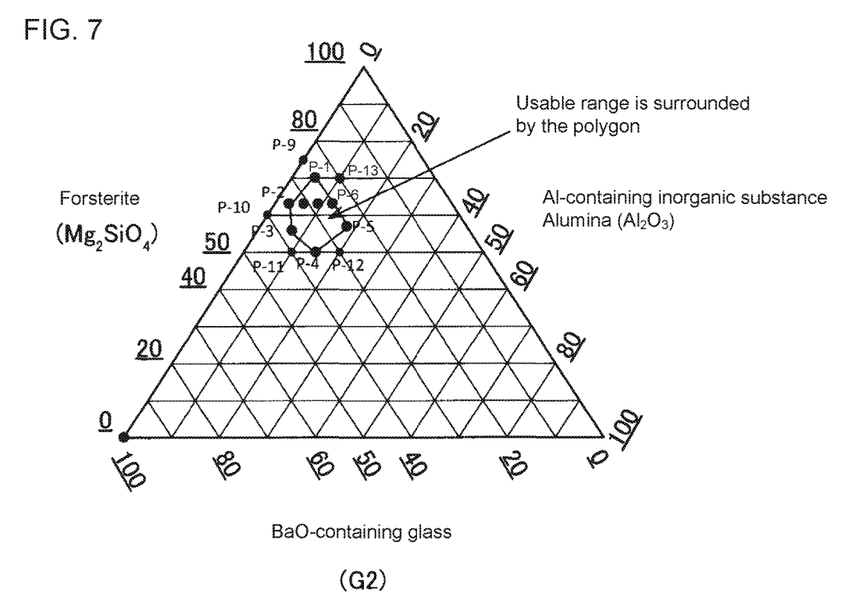
FIG. 7 is a triangular graph illustrating the correlation among the contents of three components of forsterite, alumina, and a BaO-containing glass.
Figure 8:
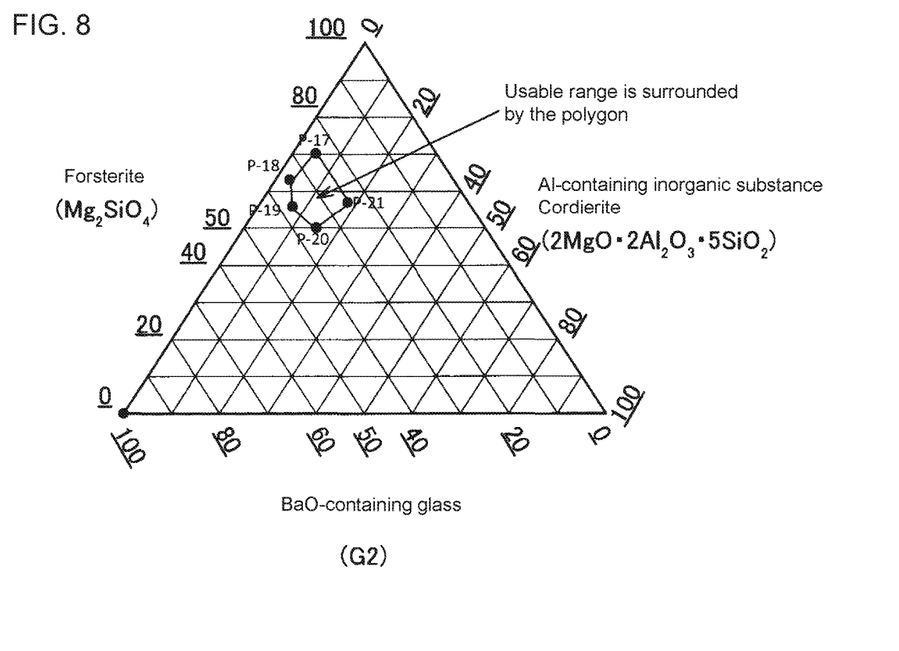
FIG. 8 is a triangular graph illustrating the correlation among the contents of three components of forsterite, cordierite, and a BaO-containing glass.

FIG. 7 is a triangular graph illustrating the correlation among the contents of three components of forsterite, alumina, and the BaO-containing glass in Sample Nos. 1 to 8 and 9 to 13 in which alumina was used as the Al-containing inorganic substance. FIG. 8 is a triangular graph illustrating the correlation among the contents of three components of forsterite, cordierite, and the BaO-containing glass in Sample Nos. 17 to 21 in which cordierite was used as the Al-containing inorganic substance. In these graphs, the regions surrounded by polygons correspond to the present disclosure.

FIGS. 7 and 8 indicate that, in the present disclosure, a forsterite powder, a BaO-containing glass, and an Al-containing inorganic substance are prepared in the preparation of the insulating ceramic paste such that, assuming that the total content of forsterite, the Al-containing inorganic substance, and the BaO-containing glass is 100 vol %, (i) the content a of forsterite satisfies 50.0 vol % ≤ a ≤ 70.2 vol %, (ii) the content b of the Al-containing inorganic substance satisfies 3.0 vol % ≤ b ≤ 18.0 vol %, and (iii) the content c of the BaO-containing glass satisfies 25.0 vol % ≤ c ≤ 37.0 vol %.

The present disclosure is not limited to the above-described embodiments and various changes can be made within the spirit and scope of the present disclosure.

Specifically, for example, in the above-described embodiments, as materials for the ceramic multilayer substrates 2, 12, and 50, mainly the forsterite powder and the glass powder are contained and, as materials for the insulating ceramic films 6, 16, 17, and 34, the forsterite powder, the Al-containing inorganic substance, and the BaO-containing glass are contained. However, even when these materials are changed and the insulating ceramic film has a thermal expansion coefficient that is lower than the thermal expansion coefficient of the ceramic multilayer substrate, similar advantages can be provided.

REFERENCE SIGNS LIST 1, 1', 11, 51 ceramic electronic component
2, 12, 50 ceramic multilayer substrate
4, 5, 14a to 14c, 15a to 15c, 32a, 32b, 33a, 33b terminal electrode
6, 16, 17, 34 insulating ceramic film
20 inner-layer ceramic green sheet
22a, 23a internal electrode
30 outer-layer ceramic green sheet
34a celsian-crystal-rich layer

The invention claimed is:

1. An insulating ceramic paste comprising an aggregate; wherein the aggregate is forsterite, an Al-containing inorganic substance, a BaO-containing glass, and a solvent,
    wherein the BaO-containing glass has a 20 to 30 mol % BaO content, when a total content of the aggregate, the Al-containing inorganic substance, and the BaO-containing glass is 100 vol %,
    (i) a content a of the aggregate satisfies 50.0 vol % < a < 70.2 vol %,
    (ii) a content b of the Al-containing inorganic substance satisfies 3.0 vol % < b < 18.0 vol %, and
    (iii) a content c of the BaO-containing glass satisfies 25.0 vol % < c < 37.0 vol %; wherein the insulating paste is used for an insulating ceramic film formed on a surface of a ceramic multilayer substrate so as to cover at least a portion of terminal electrodes formed on the surface of the ceramic multilayer substrate.

2. The insulating ceramic paste according to claim 1, wherein the Al-containing inorganic substance is alumina or cordierite.

* * * * *

UNITED STATES PATENT AND TRADEMARK OFFICE
CERTIFICATE OF CORRECTION

PATENT NO.         : 10,292,264 B2
APPLICATION NO.    : 15/951808
DATED              : May 14, 2019
INVENTOR(S)        : Sumiyo Nakamura Page 1 of 1

It is certified that error appears in the above-identified patent and that said Letters Patent is hereby corrected as shown below:

In the Specification

Column 1, Line 9, "March 27, 2103." should read -- March 27, 2013 --

Signed and Sealed this
Twenty-second Day of September, 2020

Andrei Iancu
*Director of the United States Patent and Trademark Office*